United States Patent [19]

Stapelbroek et al.

[11] Patent Number: 4,586,074
[45] Date of Patent: Apr. 29, 1986

[54] IMPURITY BAND CONDUCTION SEMICONDUCTOR DEVICES

[75] Inventors: Maryn G. Stapelbroek, Santa Ana; Michael D. Petroff, Fullerton, both of Calif.

[73] Assignee: Rockwell International Corporation, El Segundo, Calif.

[21] Appl. No.: 532,332

[22] Filed: Sep. 15, 1983

[51] Int. Cl.[4] .......................................... H01L 29/12
[52] U.S. Cl. ..................... 357/58; 357/89; 357/63; 357/83; 357/1; 357/4; 357/6; 357/33
[58] Field of Search .................. 357/58, 89, 63, 83, 357/1, 4, 6, 33

[56] References Cited

U.S. PATENT DOCUMENTS

| | | | |
|---|---|---|---|
| 3,356,866 | 12/1967 | Misawa | 357/58 X |
| 3,822,153 | 7/1974 | Loach, Jr. et al. | 357/33 X |
| 3,886,579 | 5/1975 | Ohuchi et al. | 357/58 X |
| 4,083,062 | 4/1978 | Ohuchi et al. | 357/58 X |
| 4,127,861 | 11/1978 | Deneuville | 357/33 X |
| 4,410,902 | 10/1983 | Malik | 357/33 X |

OTHER PUBLICATIONS

Brobsky et al, "Light-Sensitive Thin-Film Metal Base Transistor", *IBM Technical Disclosure Bulletin*, vol. 20, No. 9, Feb. 1978, pp. 3731-3734.
Bratt, Impurity Germanium and Silicon Infrared Detectors, in Semiconductors and Semimetals, vol. 12, p. 85 (R. K. Willardson, Ed. 1977).
Efros, et al., Impurity Conductivity in Low Compensated Semiconductors, Phys. Stat. Sol. (b), vol. 50, p. 45 (1972).
Kasuya, A Theory of Impurity Conduction I, J. Phys. Soc. Japan, vol. 13, p. 1096 (1958); Kasuya, et al., A Theory of Impurity Conduction II, J. Phys. Soc. Japan, vol. 13, p. 1287 (1958).
Miller, et al., Impurity Conduction at Low Concentrations, Phys. Rev., vol. 120, p. 745 (1960).
Mott, The Metal-Insulator Transition in Extrinsic Semiconductors, Adv. Phys., vol. 21, p. 785 (1972).
Mott, et al., The Model and General Discussion of Impurity Conduction, in Theory of Impurity Conduction, Adv. Phys., vol. 10, p. 110 (1961).
Van Lien, et al., Activation Energy of Hopping Conduction in Heavily Doped Semiconductors, Sov. Phys. Semicond., vol. 13, p. 1281 (1979).

*Primary Examiner*—Andrew J. James
*Assistant Examiner*—William A. Mintel
*Attorney, Agent, or Firm*—H. Fredrick Hamann; Craig O. Malin; John J. Deinken

[57] ABSTRACT

A semiconductor diode is designed to operate at a temperature where the thermal generation of free charge carriers is negligible. The diode includes a first semiconducting layer with a sufficient concentration of first conductivity type impurities to exhibit metallic type conductivity, a second semiconducting layer with a sufficient first conductivity type concentration to create an impurity energy band and with a second conductivity type impurity concentration less than half the first, and a blocking layer between the first and second layers with a sufficiently low impurity concentration that substantially no charge transport can occur by an impurity conduction mechanism. First and second ohmic contacts are deposited on the first and second layers opposite the blocking layer. The same types of layers are used to construct transistors.

18 Claims, 12 Drawing Figures

IMPURITY BAND CONDUCTION SEMICONDUCTOR DEVICES

BACKGROUND OF THE INVENTION

This invention relates to the field of semiconducting devices.

The design requirements of missile defense and space surveillance systems have created a need for detection and imaging systems capable of operating in the long wavelength infrared (LWIR) range. These systems impose critical performance limitations on such parameters as resolution, field-of-view, operating temperature, responsivity, detectivity, ease of calibration, and radiation hardness. In particular, the need to improve resolution and field-of-view has established the desirability of high density, large area arrays of LWIR detectors. With the large amounts of data which will be generated from these arrays, on-focal-plane signal processing will be necessary to enable scene discrimination as well as to reduce data link requirements. Silicon-based devices would appear to be well suited to meet these needs, since the large scale integration (LSI) techniques which have been extensively developed for that technology can be combined with extrinsic silicon detector technology to fabricate monolithic and hybrid focal planes.

The aforementioned systems, however, must be capable of operating in the presence and aftermath of nuclear events. Under these conditions, nuclear radiation induced ionization pulses (spikes) at the detector output can introduce an additional noise component which will reduce the ability of such a system to detect faint targets and will add to the burden of reliably interpreting the focal plane output. Thus the utility of a detection and imaging system can be enhanced by reducing the sensitivity of the system to nuclear radiation.

Although such radiation induced noise can be diminished by decreasing the detector thickness, the thickness of a conventional extrinsic silicon detector cannot be reduced sufficiently without sacrificing detector performance, leading to unacceptable dark current levels, increased optical cross talk, and degradation at low background levels by response anomalies. Blocked-impurity-band detectors, which are described in U.S. patent application Ser. No. 199,881, filed Oct. 23, 1980, provide an effective solution to the problem of operating in the nuclear radiation environment. The structure of these detectors exhibits an inherent superiority in terms of nuclear radiation hardness and reduced optical crosstalk between adjacent detectors in closely spaced arrays. Furthermore, it has also been demonstrated that blocked-impurity-band detectors are free from the types of irregular behavior, such as memory effects, pulse shape variation, nonlinear responsivity, nuclear radiation induced responsivity variations, etc., which are observed in conventional extrinsic silicon photoconductive detectors. The resulting superior frequency response and stability of calibration are substantial assets in optimizing the performance of a sensor system.

In addition to its use in a detector, however, it would also be advantageous for the impurity band conduction concept to be available in other devices. Active circuit elements incorporating this concept, for example, might find many applications. Such circuit elements could be used to fabricate multiplexers, preamplifiers, and many other active devices.

SUMMARY OF THE INVENTION

It is a general objective of this invention to provide a new and improved family of semiconducting devices based on the impurity band conduction concept.

A semiconductor diode constructed according to this invention is intended for operation at a temperature where the thermal generation of free charge carriers in the device is negligible. The diode includes a first semiconducting region having a sufficient concentration of impurities of a first conductivity type to exhibit metallic type conductivity. A second semiconducting region has a sufficient concentration of first conductivity type impurities to create an impurity energy band therein. Furthermore, the concentration of second conductivity type impurities in the second region is less than half the first conductivity type concentration. Finally, a blocking region between the first and second regions has a sufficiently low impurity concentration that substantially no charge transport can occur therein by an impurity conduction mechanism.

In more particular embodiments, the first conductivity type impurities can be donor impurities, such as arsenic in silicon, or acceptor impurities such as gallium in silicon.

In other more particular embodiments the blocking region is a blocking layer interposed between a first semiconducting layer and a second semiconducting layer, with a first ohmic contact on the first layer opposite the blocking layer and a second ohmic contact on the second layer opposite the blocking layer.

A transistor constructed according to this invention is, again, designed for operation at temperatures where the thermal generation of free charge carriers is negligible. The transistor includes a semiconducting collector with a sufficient concentration of first conductivity type impurities to exhibit metallic type conductivity and a semiconducting emitter region with a similar concentration of impurities, while the base contains a sufficient concentration of first conductivity type impurities to create an impurity energy band and a second conductivity type concentration which is less than half the concentration of first conductivity type impurities. A first blocking region is interposed between the base and the collector, while a second blocking region separates the base and the emitter.

As with the diode, the first type impurities may be donor or acceptor impurities and ohmic contacts may be added to the base, emitter, and collector.

DESCRIPTION OF THE DRAWINGS

Additional objectives, features, and advantages of the invention are discussed in the detailed description below which refers to the drawings, where:

FIG. 8 is a cross sectional side view of an n type transistor constructed according to the present invention.

DESCRIPTION OF THE INVENTION

Because of the novel approach of this invention as compared to the prior art, it will be useful to preface this description with a general discussion regarding the types of conduction which can occur in an extrinsic semiconductor material. This explanation will focus on n type material (material which contains predominantly donor impurities or defects) but, as those skilled in the art will appreciate, a similar analysis may be applied to p type material (containing predominantly acceptor impurities or defects).

Figure 1:
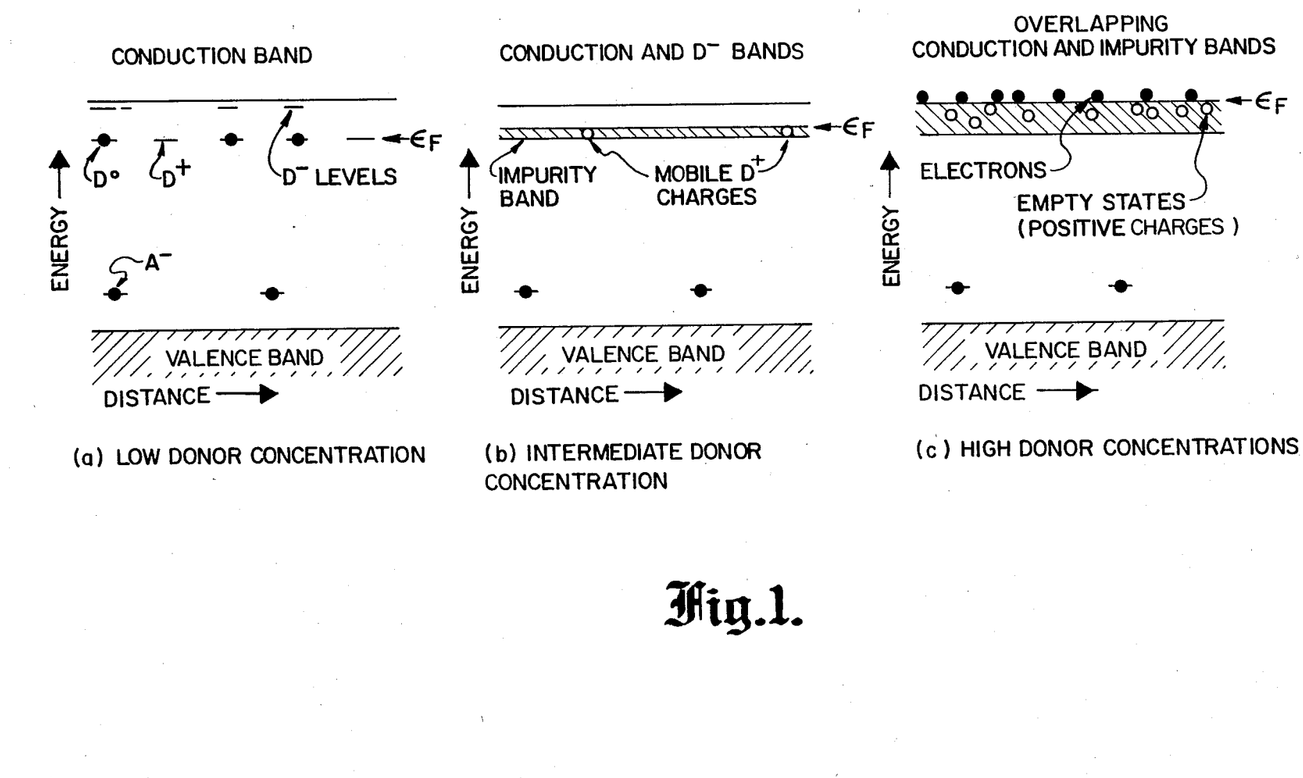
FIG. 1 shows energy level diagrams for three different levels of impurity concentration in an n-type semiconducting material.

Consider a semiconducting material containing a donor concentration $N_D$ and an acceptor concentration $N_A < N_D$ which is in thermal equilibrium at a sufficiently low temperature that the thermal generation of free charge carriers is negligible. Energy level diagrams for three possible donor concentrations in this situation are illustrated in FIG. 1. For a low donor concentration, the conditions shown in FIG. 1(a) will prevail. Here the donors and acceptors create levels in the forbidden energy gap between the valence band and the conduction band. At the specified low temperature, all carriers are frozen out onto impurity levels. It is well known that under these conditions all of the acceptors are negatively charged (and thus are designated as $A^-$ charges) and that the concentration $N_{D^+}$ of ionized donors ($D^+$ charges) is equal to the acceptor concentration $N_A$. The concentration $N_{D^o}$ of neutral donors ($D^o$) is then given by:

$$N_{D^o} = N_D - N_A. \quad (1)$$

The possibility of a donor binding two electrons (shown as $D^-$ levels) is included in FIG. 1 for completeness, although such states are not necessary for the present invention.

At this low donor concentration, the donors are sufficiently widely spaced that the tunneling of electrons between donor sites is precluded. At this low temperature, the material can be considered as an insulator although current may be carried in the material by electrons injected into the conduction band or holes injected into the valence band. Such material may be conveniently designated as 1 type material (for this invention it is not necessary to distinguish between n type and p type in this low-concentration regime).

FIG. 1(b) illustrates the case of an intermediate concentration of donors. Here the distance between impurities has decreased enough so that electrons on the donors can rapidly tunnel or "hop" from occupied to unoccupied donor sites. In effect, the donor levels merge into an "impurity band" which is separated in energy from the conduction band (and the band formed from $D^-$ states). The term "impurity band" refers to a collection of energy levels which are contained within a forbidden energy gap or band gap of a semiconductor material. At the intermediate level of concentration, charge transport can occur in the material between these energy levels without the necessity of exciting the charge carriers to the valence or conduction bands of the material. The impurity band need not necessarily be made up of true "band-like" or extended energy states, but can consist of states which are localized on impurities or defects within the material. In the latter case, charge transport can occur by means of a hopping or tunnelling type of motion between the impurity or defect sites. Because the number of empty states ($D^+$ charges) in the impurity band is equal to the number of compensating acceptors, two situations must be distinguished. If $\frac{1}{2}N_D < N_A < N_D$, then the impurity band is less than half full and the charge carriers in the impurity band can be regarded as (negatively charged) electrons. If $N_A < \frac{1}{2}N_D$, however, the charge carriers in the impurity band are the positively charged empty states or mobile $D^+$ charges. Material where $N_D$ is in the intermediate concentration range and where $N_A < \frac{1}{2}N_D$ may be denoted as D type material.

As shown in FIG. 1(c), a sufficiently high donor concentration will cause "metallic" or degenerate conductivity. Here the impurity band has broadened in energy and overlaps the conduction and/or the $D^-$ bands. In this situation, the charge carriers can, in a certain sense, be regarded as negative electrons above the Fermi level and positive empty states below the Fermi level. Material with a sufficiently high donor concentration to exhibit such "metallic" conductivity will be denoted as n+ type material.

As mentioned above, a similar analysis can be applied to p type material with the impurity band arising from acceptor levels. In this case, material where $N_A$ is in the intermediate concentration range and $N_D < \frac{1}{2}N_A$ is denoted as A type material. In A type material the role of mobile $D^+$ charges is assumed by (negatively charged) $A^-$ charges. Furthermore, p type material containing a sufficiently high concentration of acceptors to exhibit metallic conductivity is denoted as p+ type material.

Figure 2:
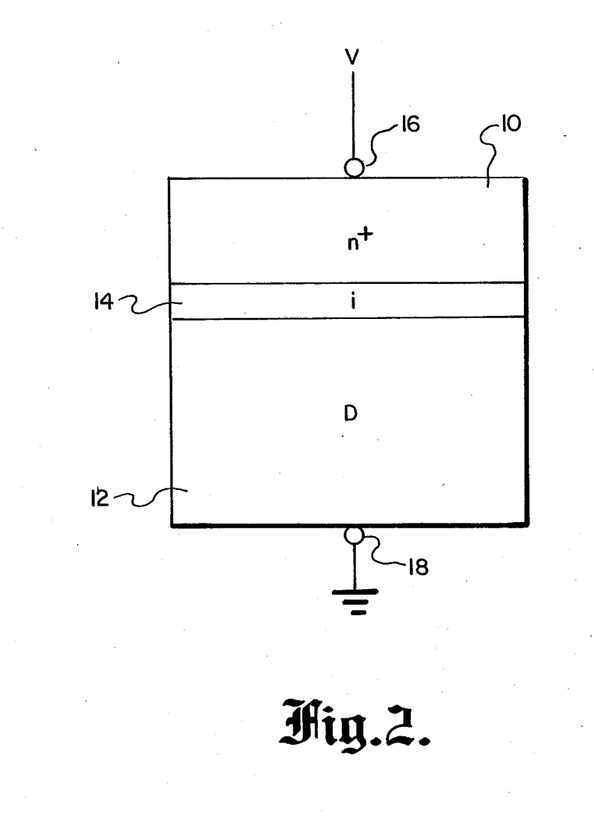
FIG. 2 is a cross sectional view illustrating a junction diode constructed in accordance with the present invention.

The structure of an n type junction diode constructed according to this invention is illustrated in a cross sectional side view in FIG. 2. An n+ layer 10 is doped with a sufficient amount of donor impurities to exhibit metallic conductivity, while a D type layer 12 is doped to a sufficient concentration of donor impurities to create an impurity energy band. In addition, the concentration of acceptor impurities in the layer 12 is held to less than half the donor concentration.

These layers are separated by a thin i type blocking layer 14, in which substantially no charge transport can occur by means of the impurity band. These characteristics of the layers 10, 12, and 14, of course, refer to the operation of the device at a temperature which is sufficiently low that the thermal generation of free charge carriers is negligible. Ohmic contacts 16 and 18 are provided to layers 10 and 12 for connecting the diode to an electrical circuit. As those skilled in the art will appreciate, an analogous p type device can be made with a p+ layer and an A type layer separated by a thin blocking layer.

Figure 3:
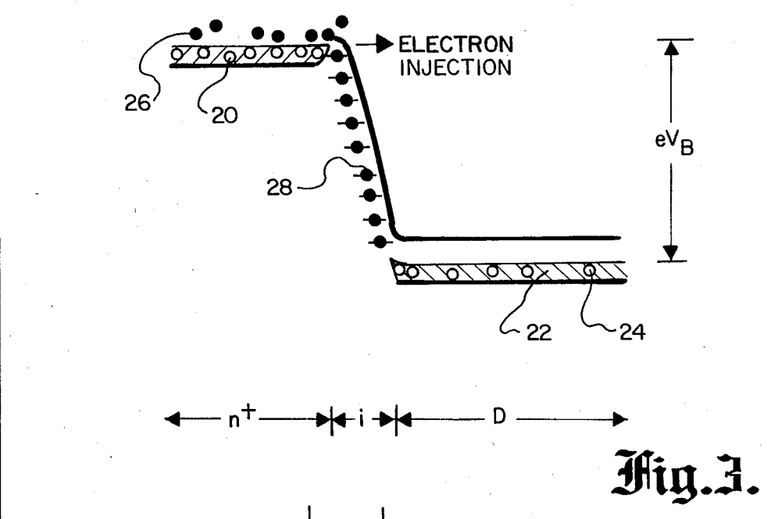
FIG. 3 is an energy band diagram for the junction diode in forward bias.
Figure 4:
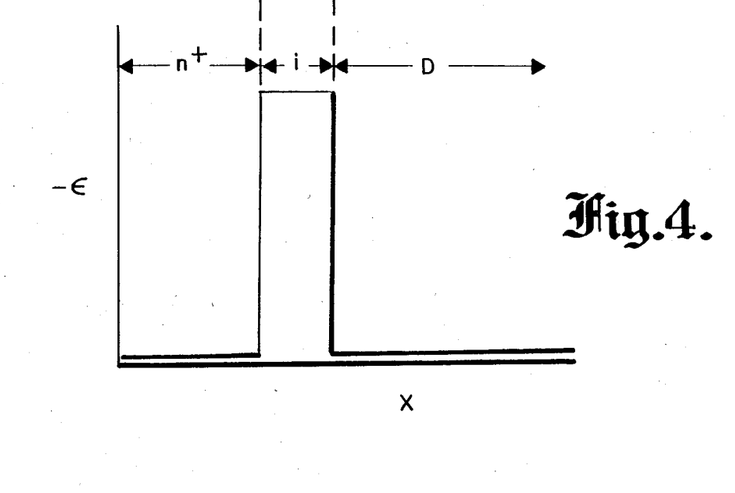
FIG. 4 is a plot graphically illustrating the electric field distribution in a forward biased junction diode.
Figure 5:
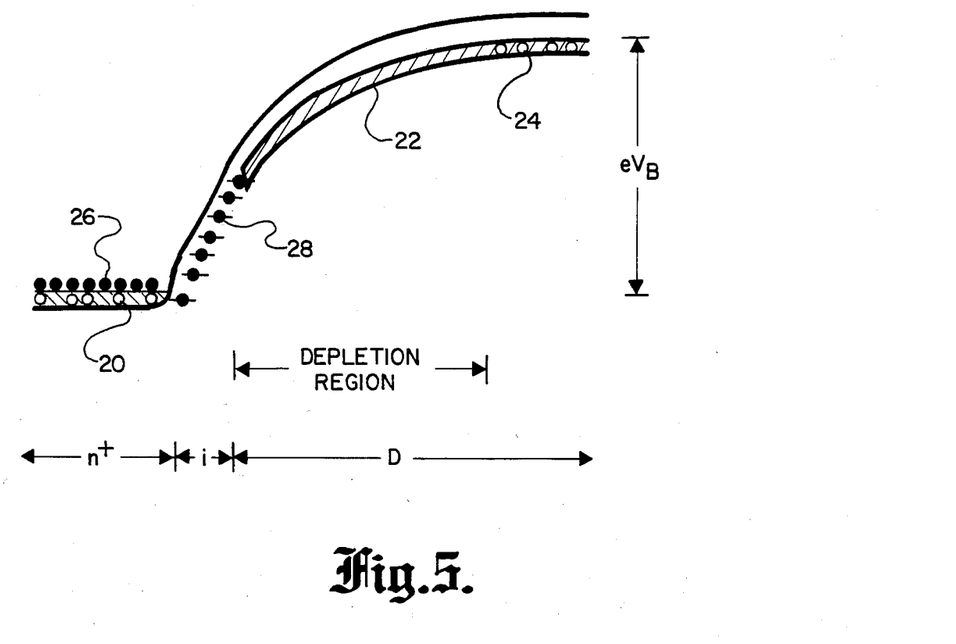
FIG. 5 is an energy band diagram for the junction diode in reverse bias.
Figure 6:
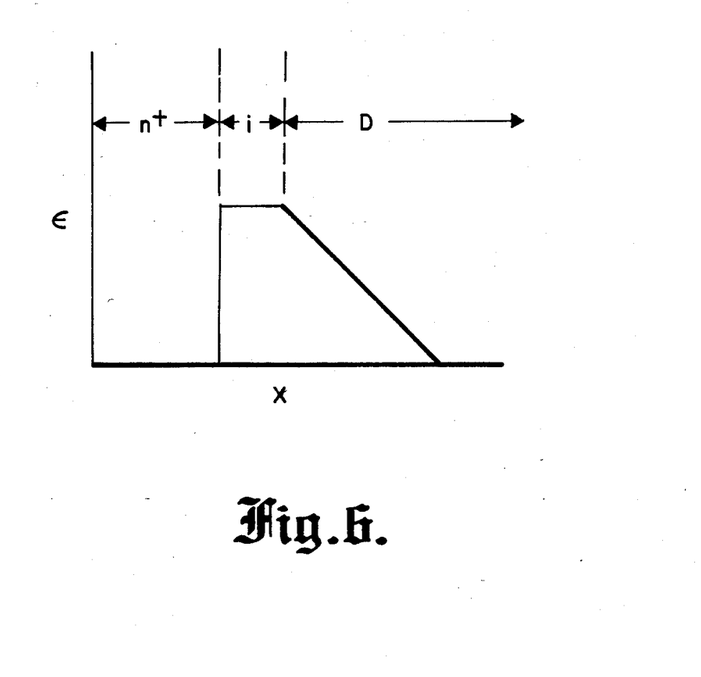
FIG. 6 is a plot of the electric field distribution in a reverse biased junction diode.

The operation of the n type junction diode of FIG. 2 can be explained in conjunction with the diagrams of FIGS. 3-6. FIG. 3 is a simplified energy band diagram representing the state of the diode upon the application of a forward bias potential (negative potential on the n+ side), with FIG. 4 showing the electric field distribution within the diode under forward bias, while FIGS. 5 and 6 illustrate the energy band diagram and electric field for a reverse bias potential. These diagrams assume that ohmic contacts to both the n+ and D type materials are provided in the low field regions sufficiently far from the junction. The shaded areas 20 and 22 represent states filled by electrons in the n+ and D type regions respectively, which contain mobile D+ charges 24. Also shown are electrons 26 and neutral donors 28.

In the forward bias condition, most of the applied bias appears across the thin blocking layer 14, since both the n+ layer 10 and D layer 12 are conducting. This results in a high electric field in the blocking layer in a direction such that the electrons 26, which are readily injected from the n+ type region into the blocking layer, will drift into the D type region. There the electrons will recombine with mobile D+ charges 24 in the low field region (or, perhaps, be collected on the ohmic contact). The low forward resistance of the diode results because of the ease with which electron injection can occur, yielding a large electron current through the junction.

The high reverse resistance of the diode arises because the positive D+ charges 24 in the n+ type material cannot be injected into the blocking layer, since no impurity band exists there, and because there are no free electrons available in the D type material to inject into the blocking layer. Therefore, no current will flow through the junction. In addition, as explained in the prior application (Ser. No. 199,881, filed Oct. 23, 1980, the teaching of which is incorporated herein by reference), the D type material near the i-D interface is depleted of D+ charges. Since the negative charge associated with the compensating acceptors is immobile, the field assumes the configuration shown in FIG. 6.

Figure 7:
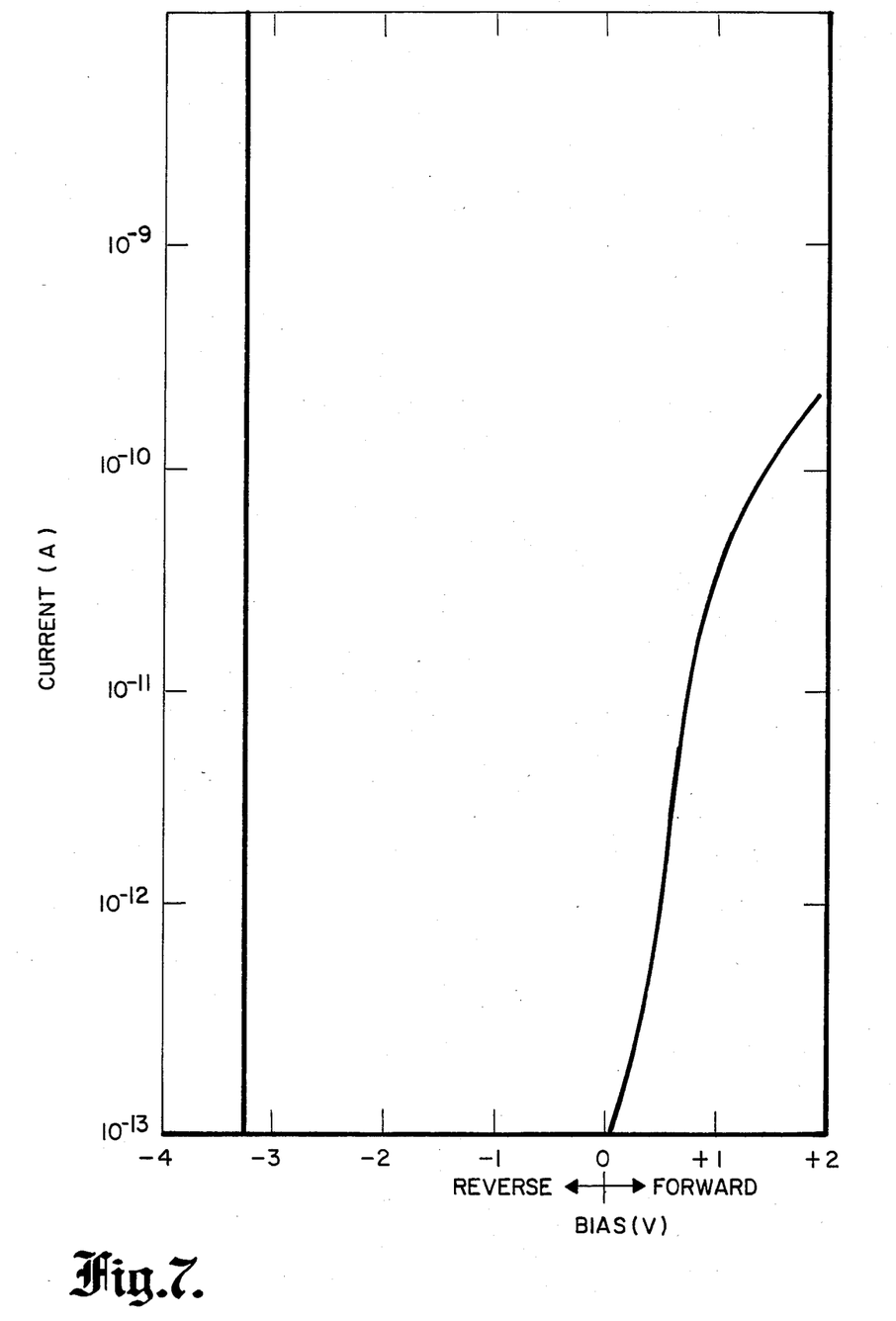
FIG. 7 is a plot showing the forward and reverse current-voltage characteristics of an n type diode.

The forward and reverse current-voltage characteristics of an n type diode are shown in FIG. 7. This data was obtained for a silicon based device doped with arsenic and measured at 8 K. The reverse current was less than $10^{-13}$ A until breakdown near $-3$ V applied bias, while the forward current was approximately $3.5 \times 10^{-11}$ A at $+1$ V. The breakdown in reverse bias is believed to occur when the depletion region extends to the electrical contact with the D type material.

Junction diodes can be combined according to this invention to form transistors in much the same way as conventional p-n diodes can be combined to form bipolar npn and pnp transistors. The structure of such an n type transistor is shown in a cross sectional side view in FIG. 8. A D type base 30 is doped with a sufficient concentration of donor impurities to create an impurity energy band, with the concentration of acceptor impurities held to less than half the donor concentration. An n+ collector 32 is doped to exhibit metallic conductivity, and an n+ emitter 34 is similarly doped to metallic conductivity. A first blocking region 36 is placed between the base and the collector, while a second blocking region 38 is between the base and the emitter. These i type blocking regions have a low concentration of impurities, so that substantially no charge transport can occur by means of the impurity conduction mechanism. Ohmic contacts 40, 42, and 44 are provided to the base, collector, and emitter. In operation, when the emitter-base junction is forward biased and the base-collector junction is reverse biased, the transistor is turned on. Reverse biasing the emitter-base junction will turn the transistor off, as is the case for conventional bipolar transistors.

Figure 9:
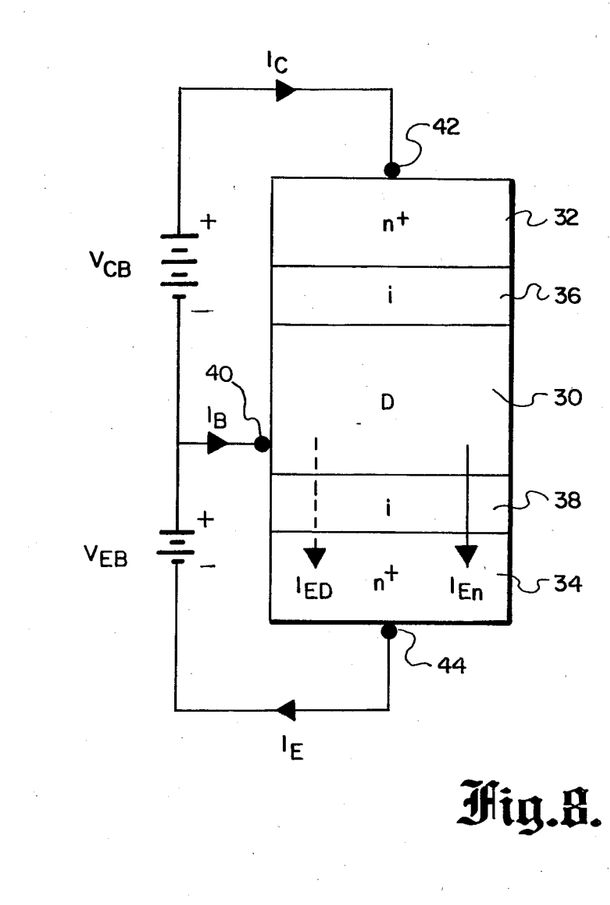
FIG. 9 illustrates the energy band diagram and electric field distribution for an n type transistor.
Figure 10:
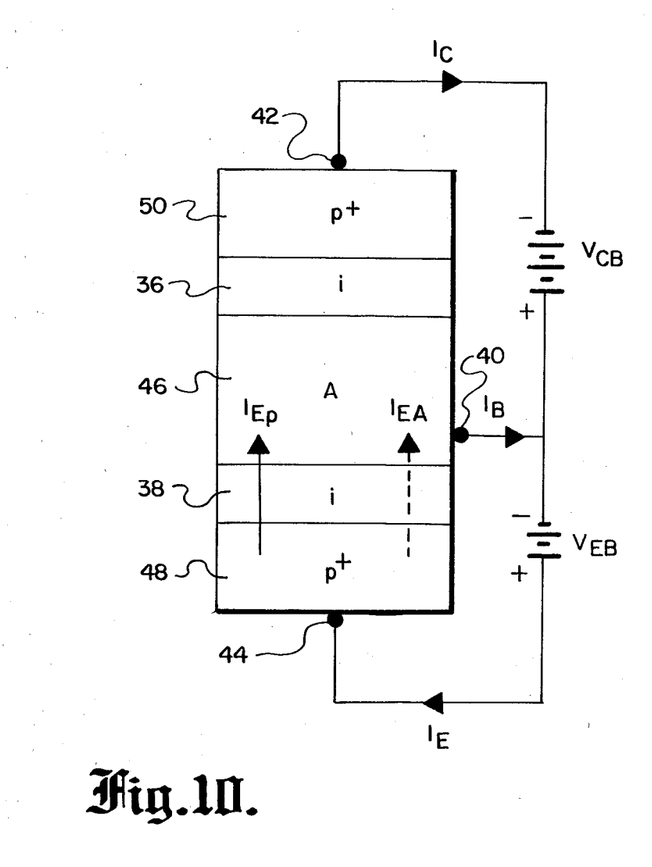
FIG. 10 is a cross sectional side view of a p type transistor.

An approximate band diagram and electric field distribution for the transistor of FIG. 8 are shown in FIG. 9. Because of the forward bias of the emitter-base junction, electrons 26 are injected from the emitter into the base. After traversing the thin, approximately field-free region of the base which has not been depleted by the reverse bias applied to the base-collector junction, the electrons are again driven toward the collector by the field in the depletion region. The width of the approximately field-free region can be controlled by adjusting the base-collector junction bias. An analogous p type transistor is shown in FIG. 10, with elements similar to those of the transistor of FIG. 8, except that the base 46 is A type material, the emitter 48 is p+ type material, and the collector 50 is p+ type material.

The equations describing the various currents in the n type detector are analogous to those for a conventional bipolar transistor, that is:

$$I_E = I_{En} + I_{ED} \quad (2)$$

$$I_C = \beta I_{En} + I_{co} = \beta \gamma I_E + I_{co} = \alpha I_E + I_{co} \quad (3)$$

$$I_B = (1-\alpha)I_E - I_{co} \quad (4)$$

Here, $I_{En}$ is the current through the emitter-base junction due to injected electrons, $I_{ED}$ is the (possible) leakage current of D+ charges from the base to the emitter, and $I_{co}$ is the reverse leakage current of the base-collector junction. The parameter $\beta$ represents the probability that an injected electron will reach the depletion region (the transport efficiency), $\gamma = I_{En}/I_E$ is the emitter injection efficiency, and $\alpha = \beta \gamma$ is the current-amplification factor. Because of the blocking layer, $I_{ED} \ll I_{En}$, so that $\gamma \approx 1$. The transport efficiency, $\beta$, can be controlled by $V_{CB}$ and can be made very close to unity so that a current-amplification factor of $\alpha$ close to unity can be obtained. These parameters are analogous to those used in describing conventional bipolar transistors.

Figures 11, 12:
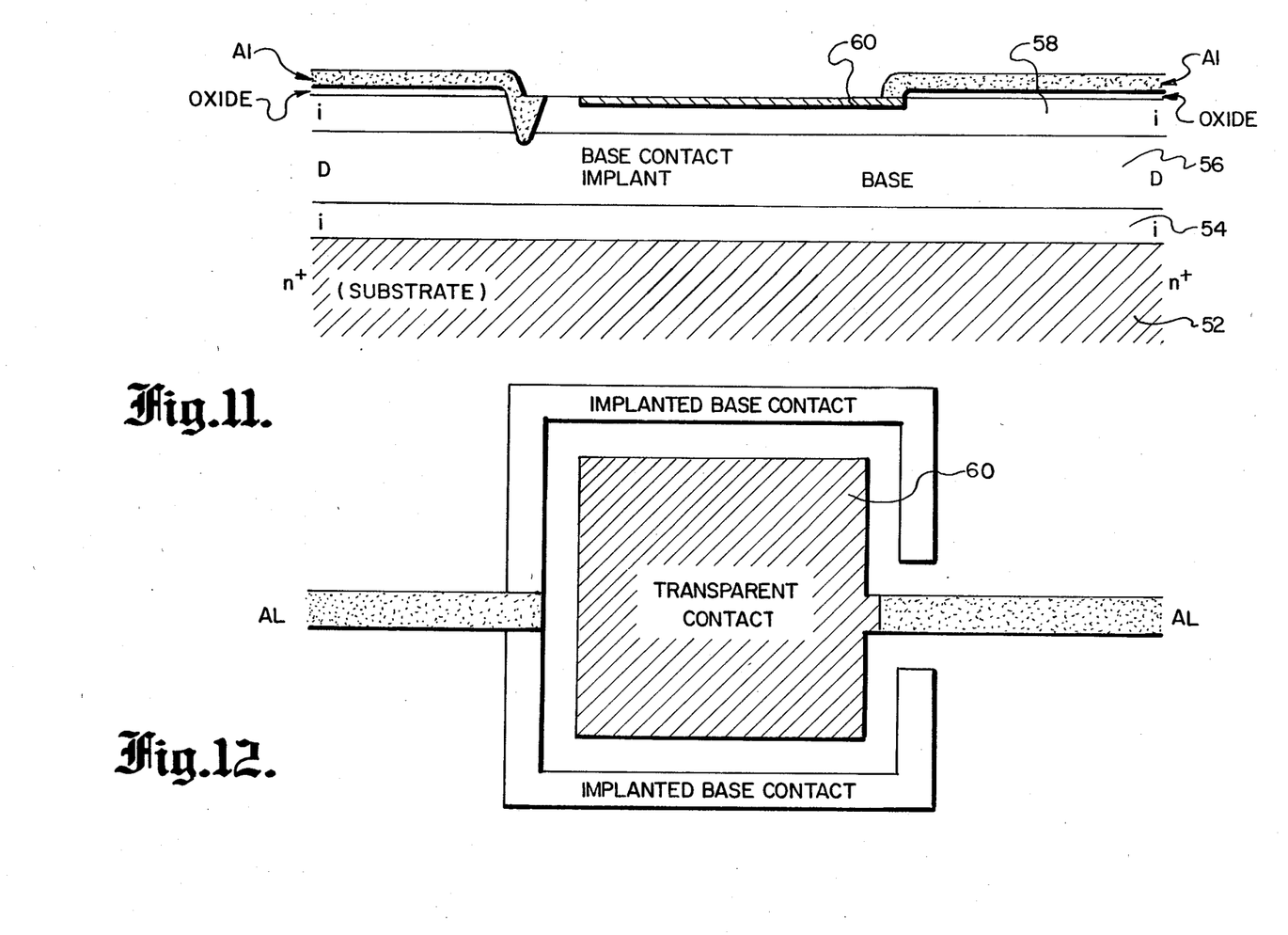
FIG. 11 is a cross sectional side view of an n type photo-transistor.
FIG. 12 is a plan view of the phototransistor shown in FIG. 11.

FIGS. 11 and 12 illustrate, in cross sectional side and plan views, respectively, one embodiment of a phototransistor constructed according to this invention. An n+ emitter substrate 52 is doped sufficiently to exhibit metallic conductivity. A first blocking layer 54 is deposited on the emitter with a sufficiently low amount of impurities that substantially no charge transport can occur by means of the impurity band. A D type base layer 56 is deposited on the first blocking layer. A second blocking layer 58 is deposited on the base, and an n+ collector region 60 is implanted in the second blocking layer with a sufficient amount of impurities to exhibit metallic type conductivity. The base layer 56 is absorbing at the wavelength of radiation which is to be detected, while the collector region and the second blocking layer are transparent. Radiation incident from the top of the device passes through the transparent contact collector 60 and blocking layer 58 and is absorbed in the base 56, creating a mobile D+ and electron pair. The electron is immediately collected while the presence of the D+ charge in the base increases the field on the emitter-base junction to cause the injection of additional electrons. Since any particular injected electron has only a small probability of recombining with the radiation-induced D+ charge, many electrons can be injected for each D+ charge created and a large current will flow in the emitter circuit. The device will thus have a high gain. Although this phototransistor could be operated with the base contact left floating, a base contact is provided to allow control of the dark current. As those skilled in the art will appreciate, such a phototransistor can also be operated with the emitter and collector interchanged, provided appropriate channel stops are included.

Although some typical embodiments of the present invention have been illustrated and discussed above, modifications and additional embodiments of the invention will undoubtedly be apparent to those skilled in the art. Various changes, for example, may be made in the configurations, sizes, and arrangements of the components without departing from the scope of the invention. Furthermore, equivalent elements may be substituted for those illustrated and described herein, parts or connections might be reversed or otherwise interchanged, and certain features of the invention might be utilized independently of the use of other features. Consequently, the examples presented herein, which are provided to teach those skilled in the art how to utilize the advantages of this invention, should be considered as illustrative only and not inclusive, the appended claims being more indicative of the full scope of the invention.

We claim:

1. A semiconductor diode for operation at a temperature such that the thermal generation of free charge carriers is negligible, comprising:
   a first semiconducting region with a sufficient concentration of first conductivity type impurities to exhibit metallic type conductivity;
   a second semiconducting region with a sufficient concentration of first conductivity type impurities to create an impurity energy band and with a second conductivity type impurity concentration less than half said first type concentration; and
   a blocking region between said first and second regions with a sufficiently low impurity concentration that substantially no charge transport can occur by an impurity conduction mechanism.

2. The diode of claim 1, wherein said first conductivity type impurities further comprise donor impurities.

3. The diode of claim 2, wherein said first, second, and blocking regions comprise silicon and said first conductivity type impurities comprise arsenic.

4. The diode of claim 2, wherein said first semiconducting region further comprises a first semiconducting layer, said blocking region further comprises a blocking layer disposed on said first layer, and said second semiconducting region further comprises a second semiconducting layer deposited on said blocking layer.

5. The diode of claim 4, further comprising:
   a first ohmic contact disposed on said first layer opposite said blocking layer, and
   a second ohmic contact disposed on said second layer opposite said blocking layer.

6. The diode of claim 1, wherein said first conductivity type impurities further comprise acceptor impurities.

7. The diode of claim 6, wherein said first, second, and blocking regions comprise silicon and said first conductivity type impurities comprise germanium.

8. The diode of claim 6, wherein said first semiconducting region further comprises a first semiconducting layer, said blocking region further comprises a blocking layer disposed on said first layer, and said second semiconducting region further comprises a second semiconducting layer on said blocking layer.

9. The diode of claim 8, further comprising:
   a first ohmic contact disposed on said first layer opposite said blocking layer, and
   a second ohmic contact disposed on said second layer opposite said blocking layer.

10. A semiconductor diode for operation at a temperature such that the thermal generation of free charge carriers is negligible, comprising:
    a first semiconducting layer with a sufficient concentration of first conductivity type impurities to exhibit metallic type conductivity;
    a second semiconducting layer with a sufficient concentration of first conductivity type impurities to create an impurity energy band and with a second conductivity type impurity concentration less than half said first type concentration;
    a blocking layer between said first and second layers with a sufficiently low impurity concentration that substantially no charge transport can occur by an impurity conduction mechanism;
    a first ohmic contact disposed on said first layer opposite said blocking layer; and
    a second ohmic contact disposed on said second layer opposite said blocking layer.

11. A transistor for operation at a temperature such that the thermal generation of free charge carriers is negligible, comprising:
    a semiconducting collector with a sufficient concentration of first conductivity type impurities to exhibit metallic type conductivity;
    a semiconducting base with a sufficient concentration of first conductivity type impurities to create an impurity energy band and with a second conductivity type impurity concentration less than half said first type concentration;
    a semiconducting emitter with a sufficient concentration of first conductivity type impurities to exhibit metallic type conductivity;
    a first blocking region interposed between said base and said collector; and
    a second blocking region interposed between said base and said emitter,
    said blocking regions having sufficiently low impurity concentrations that substantially no charge transport can occur by an impurity conduction mechanism.

12. The transistor of claim 11, wherein said first conductivity type impurities further comprise donor impurities.

13. The transistor of claim 12, wherein said collector further comprises a collector layer, said first blocking region further comprises a first blocking layer deposited on said collector layer, said base further comprises a base layer deposited on said first blocking layer opposite said collector layer, said second blocking region further comprises a second blocking layer deposited on said base layer opposite said first blocking layer, and said emitter further comprises an emitter layer deposited on said second blocking layer opposite said base layer.

14. The transistor of claim 13, further comprising:
    a first ohmic contact disposed on said collector layer opposite said first blocking layer;
    a second ohmic contact disposed on said emitter layer opposite said second blocking layer; and
    a third ohmic contact disposed on said base layer.

15. The transistor of claim 11, wherein said first conductivity type impurities further comprise acceptor impurities.

16. The transistor of claim 15, wherein said collector further comprises a collector layer, said first blocking region further comprises a first blocking layer deposited on said collector layer, said base further comprises a base layer deposited on said first blocking layer opposite said collector layer, said second blocking region further comprises a second blocking layer deposited on said base layer opposite said first blocking layer, and said emitter further comprises an emitter layer deposited on said second blocking layer opposite said base layer.

17. The transistor of claim 16, further comprising:
a first ohmic contact disposed on said collector layer opposite said first blocking layer;
a second ohmic contact disposed on said emitter layer opposite said blocking layer; and
a third ohmic contact disposed on said base layer.

18. A transistor for operation at a temperature such that the thermal generation of free charge carriers is negligible, comprising:

a semiconducting collector layer with a sufficient concentration of first conductivity type impurities to exhibit metallic type conductivity;
a first blocking layer deposited on said collector layer with a sufficiently low impurity concentration that substantially no charge transport can occur by an impurity conduction mechanism;
a semiconducting base layer deposited on said first blocking layer opposite said collector layer with a sufficient concentration of first conductivity type impurities to create an impurity energy band and with a second conductivity type impurity concentration less than half said first type concentration;
a second blocking layer deposited on said base layer opposite said first blocking layer with a sufficiently low impurity concentration that substantially no charge transport can occur by an impurity conduction mechanism;
a semiconducting emitter layer deposited on said second blocking layer opposite said base layer with a sufficient concentration of first conductivity type impurities to exhibit metallic type conductivity;
a first ohmic contact disposed on said collecting layer opposite said first blocking layer;
a second ohmic contact disposed on said emitter layer opposite said second blocking layer; and
a third ohmic contact disposed on said base layer.

* * * * *